US008198956B2

(12) United States Patent
U-Yen et al.

(10) Patent No.: US 8,198,956 B2
(45) Date of Patent: Jun. 12, 2012

(54) COMPACT PLANAR MICROWAVE BLOCKING FILTERS

(75) Inventors: Kongpop U-Yen, Alexandria, VA (US); Edward J. Wollack, Clarksville, MD (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 183 days.

(21) Appl. No.: 12/535,954

(22) Filed: Aug. 5, 2009

(65) Prior Publication Data

US 2010/0033266 A1 Feb. 11, 2010

Related U.S. Application Data

(60) Provisional application No. 61/086,318, filed on Aug. 5, 2008.

(51) Int. Cl.
*H03H 7/00* (2006.01)

(52) U.S. Cl. ....................... 333/176; 333/204; 333/99 S

(58) Field of Classification Search .................. 333/176, 333/185, 204, 99 S
See application file for complete search history.

(56) References Cited

U.S. PATENT DOCUMENTS

| | | | | |
|---|---|---|---|---|
| 3,879,690 A * | 4/1975 | Golant et al. | ................. | 333/204 |
| 5,584,067 A * | 12/1996 | Buer et al. | ..................... | 455/302 |
| 5,977,847 A * | 11/1999 | Takahashi | ..................... | 333/204 |
| 6,570,472 B1 * | 5/2003 | Niiranen | ....................... | 333/204 |
| 6,621,382 B2 * | 9/2003 | Nitta | ............................. | 333/204 |
| 6,741,142 B1 * | 5/2004 | Okazaki et al. | .............. | 333/99 S |
| 2004/0246071 A1 * | 12/2004 | Rottmoser et al. | ............ | 333/134 |
| 2008/0117004 A1 * | 5/2008 | Mochizuki | .................... | 333/204 |

OTHER PUBLICATIONS

Shaman et al., "An Optimum Ultra-Wideband (UWB) Bandpass filter with Spurious Response Suppression", Wireless & Microwave Tech. conf. Dec. 2006, pp. 1-5.*

* cited by examiner

*Primary Examiner* — Seungsook Ham

(57) ABSTRACT

A compact planar microwave blocking filter includes a dielectric substrate and a plurality of filter unit elements disposed on the substrate. The filter unit elements are interconnected in a symmetrical series cascade with filter unit elements being organized in the series based on physical size. In the filter, a first filter unit element of the plurality of filter unit elements includes a low impedance open-ended line configured to reduce the shunt capacitance of the filter.

14 Claims, 12 Drawing Sheets

600

700

1200

COMPACT PLANAR MICROWAVE BLOCKING FILTERS

PRIORITY CLAIM

This application claims priority under 35 U.S.C. §119 to U.S. Provisional Application Ser. No. 61/086,318 entitled "COMPACT PLANAR MICROWAVE BLOCKING FILTER" filed on Aug. 5, 2008, the entire contents of which are hereby incorporated by reference.

ORIGIN OF THE INVENTION

The invention described herein was made by an employee of the United States Government, and may be manufactured and used by or for the Government for governmental purposes without the payment of any royalties thereon or therefore.

BACKGROUND OF THE INVENTION

1. Field of the Invention

This application relates to electromagnetic filters, and in particular, to compact planar microwave blocking filters.

2. Background

Cryogenic electronics systems may contain low-noise devices such as Josephson tunnel junctions, coulomb blockade devices, and bolometric detectors. Microwave thermal blocking filters may be utilized in the cryogenic electronics systems to realize isolation between cooled elements of the low-noise devices and room temperature readout and bias electronics. The use of thermal blocking filters may prevent degradation of the detector performance from Johnson noise emitted at warmer elements of electronics required by the sensor system.

Providing a low-noise DC bias line to the detectors is possible using a large value shunt capacitor. However, realizing this function with a broadband readout capability is challenging. A dissipative conventional approach includes utilizing a resistor loaded filter. In this approach, microwave power is absorbed along the filter structure to provide broadband attenuation. However, to provide sufficient attenuation at high frequency, the resister loaded filter requires a long line, which in turn creates a large capacitance and limits the operating bandwidth of the signal. Additionally, this approach requires the use of lossy, or loaded, dielectric materials, which are not compatible with thin film fabrication processes. A non-dissipative approach may be effective at blocking thermal noise power, however, the approach must adequately address spurious transmission resonances and sensitivity to impedance matching.

Thus, it may be beneficial to provide microwave thermal blocking filters which overcome these problems.

BRIEF SUMMARY

A compact planar microwave blocking filter includes a dielectric substrate and a plurality of filter unit elements disposed on the substrate. The filter unit elements are interconnected in a symmetrical series cascade with filter unit elements being organized in the series based on physical size. In the filter, a first filter unit element of the plurality of filter unit elements includes a low impedance open-ended line configured to reduce the shunt capacitance of the filter.

A compact planar microwave blocking filter includes a thin dielectric substrate and a plurality of filter unit elements disposed on the substrate. The filter unit elements are interconnected in a symmetrical series cascade with filter unit elements being organized in the series based on increasing physical size. In the filter, each filter unit element of the plurality of filter unit elements includes a low impedance open-ended line configured to reduce the total shunt capacitance of the filter and reduce radiation loss of the filter.

A compact planar microwave blocking filter includes a thin dielectric substrate, a plurality of filter unit elements disposed on the substrate, and a housing disposed on the thin dielectric substrate and covering the plurality of filter unit elements. The filter unit elements are interconnected in a symmetrical series cascade with filter unit elements being organized in the series based on increasing physical size. The housing includes two input pockets on either side of a largest filter unit element of the plurality of filter unit elements. In the filter, each filter unit element of the plurality of filter unit elements includes a low impedance open-ended line configured to reduce the total shunt capacitance of the filter and reduce radiation loss of the filter.

DETAILED DESCRIPTION

Figure 1:
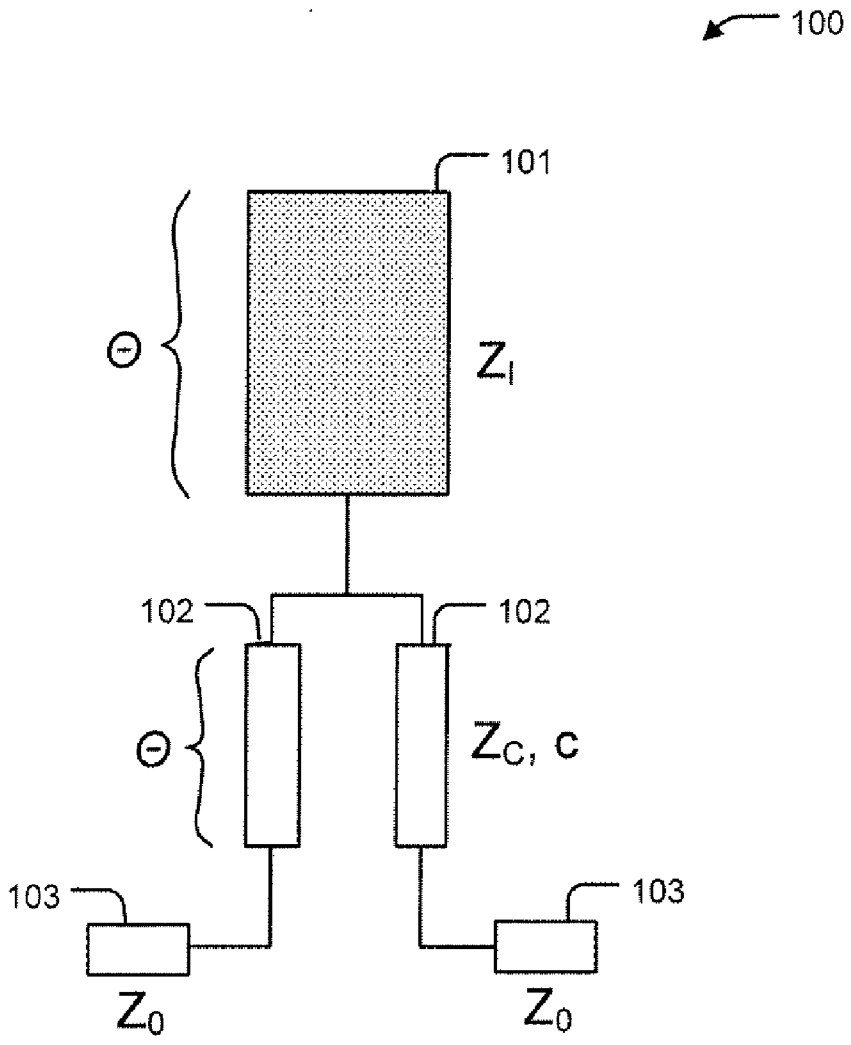
FIG. 1 is a unit element of a microwave blocking filter, according to an example embodiment.

Detailed illustrative embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Hereinafter, example embodiments will be described with reference to the attached drawings.

Example embodiments of the present invention include a compact filter design technique utilizing a cascaded band-stop filter to produce large broadband microwave blocking capability. Example embodiments further include techniques to reduce a filter's equivalent DC shunt capacitance and to control radiation loss.

Example embodiments of the present invention are thus directed to compact planar broadband microwave blocking filters. The filters may be constructed from multiple sections of band-stop filters with means to control radiation loss. The filters are scalable thereby enabling blocking of a plurality of frequencies depending upon any particular scale used.

According to example embodiments, a microwave blocking filter includes a plurality of compact band-stop filters or unit elements. The unit elements are scaled to suppress various frequency bands such that the microwave blocking filter provides relatively low radiation leakage and achieves a targeted total filter shunt capacitance. The microwave blocking filter includes stepped impedance coupled line filters arranged as the unit elements. Hereinafter, a plurality of unit elements are described with reference to FIGS. 1-4.

FIG. 1 is a unit element of a microwave blocking filter, according to an example embodiment. The unit element 100 includes a low impedance open-ended line 101. The low impedance line 101 may have a characteristic impedance $Z_1$. The unit element 100 further includes a coupled line portion 102 in communication with the low impedance line 101. The coupled line portion 102 may have a characteristic impedance $Z_c$. The unit element 100 further includes terminations 103 in communication with the coupled line portion 102, each termination 103 having an impedance $Z_0$. The electrical length of both the low impedance line 101 and the coupled line portion 102 is θ.

Figure 2:
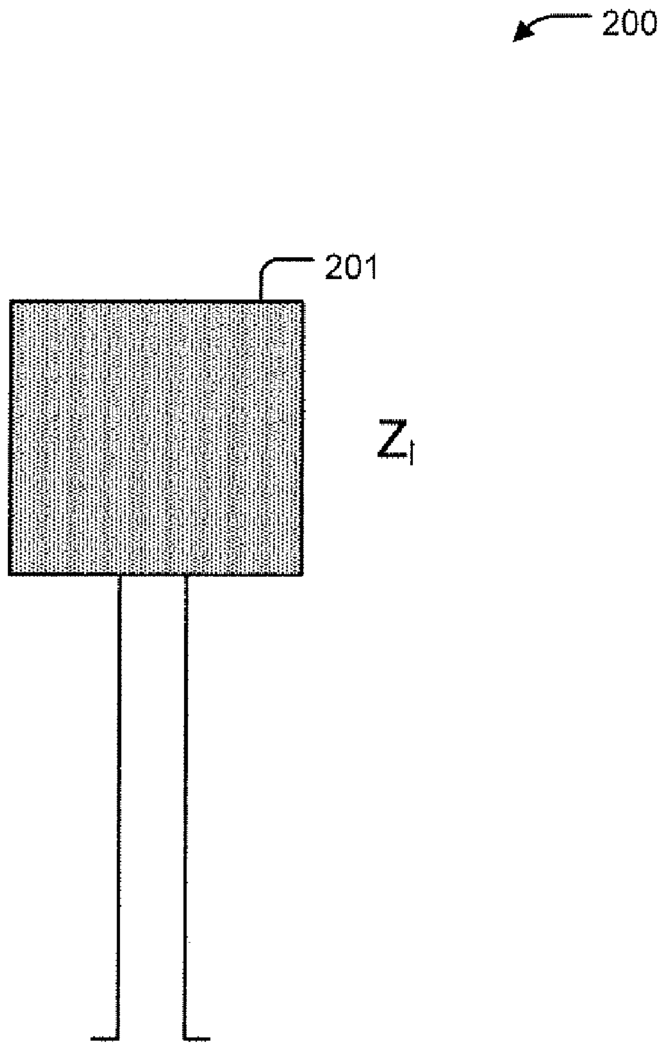
FIG. 2 is a unit element of a microwave blocking filter, according to an example embodiment.

FIG. 2 is a unit element of a microwave blocking filter, according to an example embodiment. The unit element 200 includes a low impedance open-ended line 201. The low impedance line 201 may have a characteristic impedance $Z_1$. Unit element 200 further includes a coupled line portion in communication with the low impedance line 201, and terminations. However, labels have been omitted for clarity in the drawings. The electrical length of both the low impedance line 201 and the coupled line portion is θ.

Figure 3:
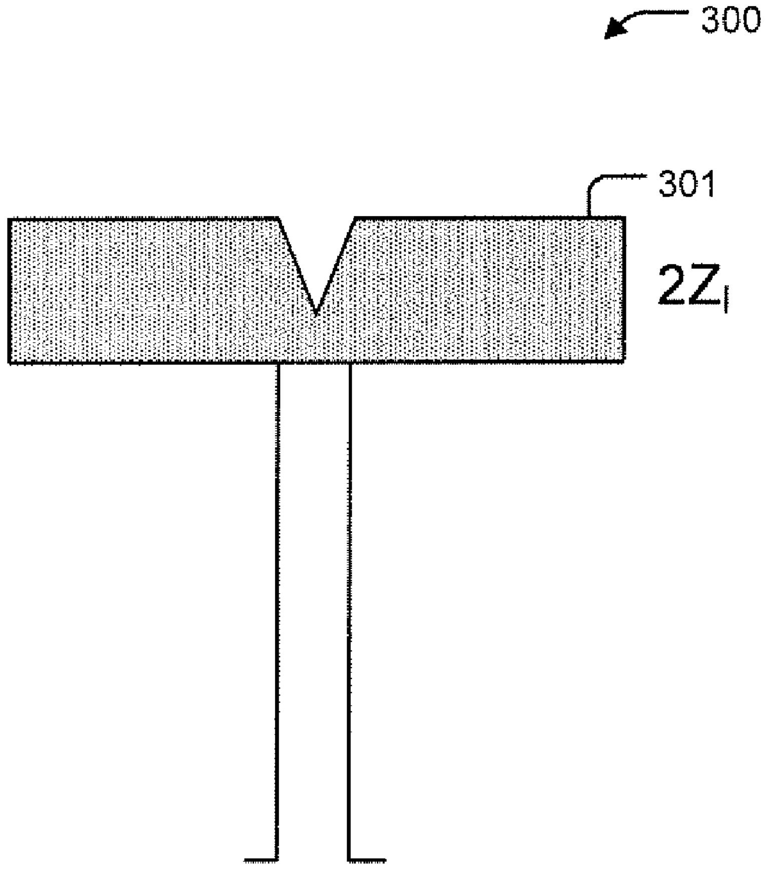
FIG. 3 is a unit element of a microwave blocking filter, according to an example embodiment.

FIG. 3 is a unit element of a microwave blocking filter, according to an example embodiment. The unit element 300 includes a low impedance open-ended line 301. The low impedance line 301 may have a characteristic impedance $2Z_1$. Unit element 300 further includes a coupled line portion in communication with the low impedance line 301, and terminations. However, labels have been omitted for clarity in the drawings. The electrical length of both the low impedance line 301 and the coupled line portion is θ.

Figure 4:
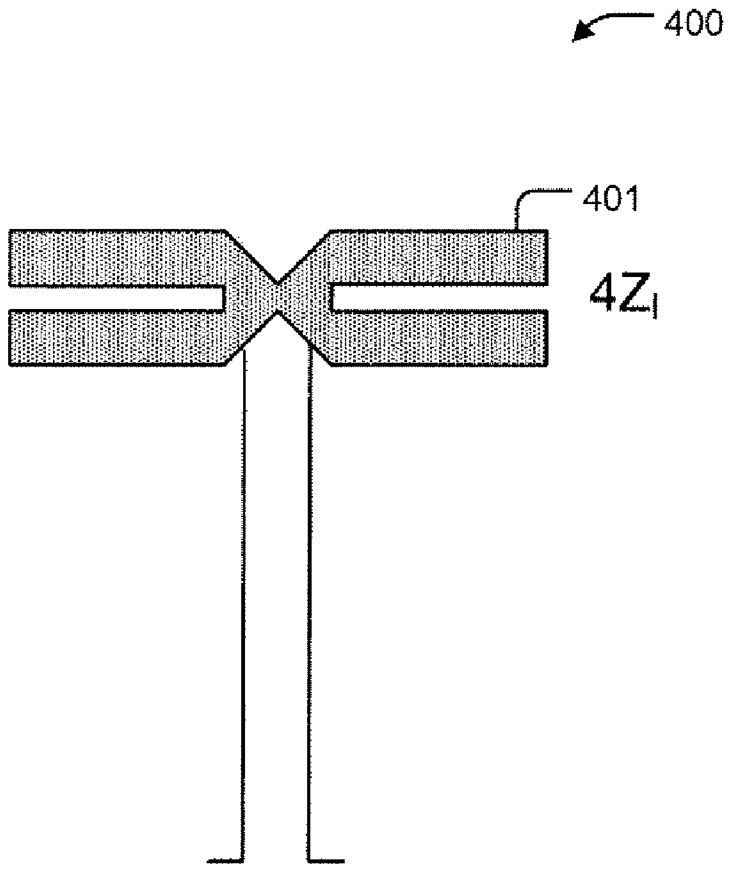
FIG. 4 is a unit element of a microwave blocking filter, according to an example embodiment.

FIG. 4 is a unit element of a microwave blocking filter, according to an example embodiment. The unit element 400 includes a low impedance open-ended line 401. The low impedance line 401 may have a characteristic impedance $4Z_1$. Unit element 400 further includes a coupled line portion in communication with the low impedance line 401, and terminations. However, labels have been omitted for clarity in the drawings. The electrical length of both the low impedance line 401 and the coupled line portion is θ.

Figure 5:
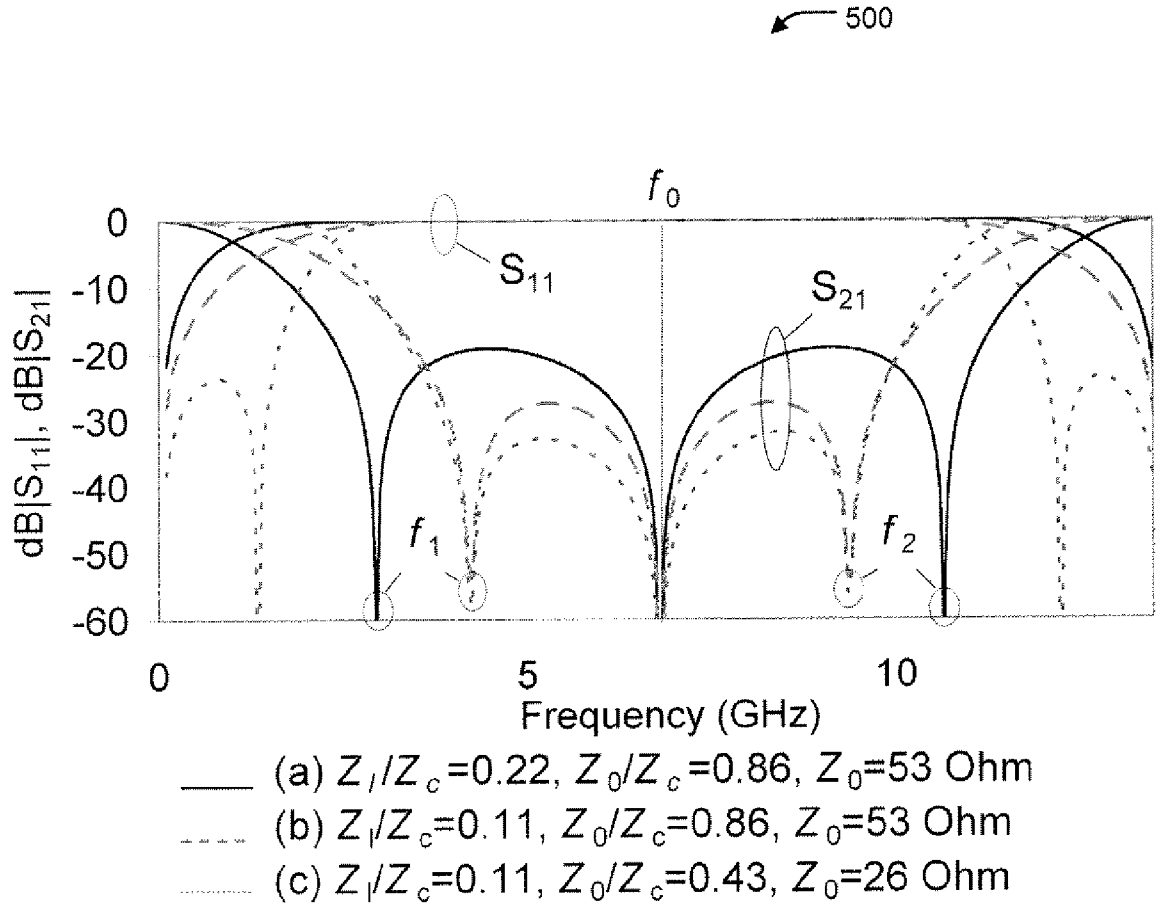
FIG. 5 is a graph depicting the frequency responses of three (3) unit elements of a microwave blocking filter, according to an example embodiment.

Each unit element 100, 200, 300, and 400 is scaled to an electrical length ideally generating three transmission zeros frequencies $f_0$, $f_1$, and $f_2$ in the stop-band, thus increasing and/or maximizing bandwidth, as shown in FIG. 5. FIG. 5 is a graph depicting the frequency responses of three (3) unit elements of a microwave blocking filter, according to an example embodiment. Particularly, FIG. 5 depicts the frequency response of three (3) unit elements (200, 300, and 400).

Increased and/or maximized bandwidth may occur if the electrical lengths θ of unit elements 200, 300, and 400 are approximately equal to a quarter-wavelength at the center frequency $f_0$. Thereafter, $f_1$ and $f_2$ may be analytically determined through Equations (1) and (2) below:

$$\frac{f_1}{f_0} = \frac{2}{\pi}\tan^{-1}\sqrt{\frac{2Z_l}{Z_{c,e} - Z_{c,0}(1 + 2Z_l/Z_{c,e})}} \qquad \text{Equation (1)}$$

$$\frac{f_2}{f_0} = 2 - \frac{f_1}{f_0} \qquad \text{Equation (2)}$$

$Z_{c,e}$ and $Z_{c,0}$ are even-mode and odd-mode characteristic impedances of the coupled line $Z_c$. The coupling coefficient 'c' of $Z_c$, is defined in Equation (3) below:

$$c = \frac{Z_{c,e} - Z_{c,0}}{Z_{c,e} + Z_{c,0}} \qquad \text{Equation (3)}$$

The overall filter length (e.g., including all unit elements) may be reduced through use of a relatively small $f_1/f_0$ ratio. Referring to Equation (1), filter length may be reduced by adjusting c, and $Z_1$. Referring to Equation (1) and (2), increasing $Z_0/Z_c$ ratio does not affect $f_1$ and $f_2$, however the increase in $Z_0/Z_c$ increases the filter's stop-band attenuation and pass-band return loss level as shown in FIG. 5.

To minimize the total capacitance of the microwave blocking filter, $Z_c$ and c are set to the highest allowable value. $Z_0$ is also set to a high value to reduce and/or minimize the line capacitance that is used to interconnect unit elements. For example, the highest allowable value may correspond to the maximum or near maximum value attainable through a particular manufacturing process. It is noted that in practice the maximum value may not necessarily be fixed for any manufacturing process. Thus example embodiments of the present invention should not be limited to a single fixed value, as materials and processing methods change.

Figure 6:
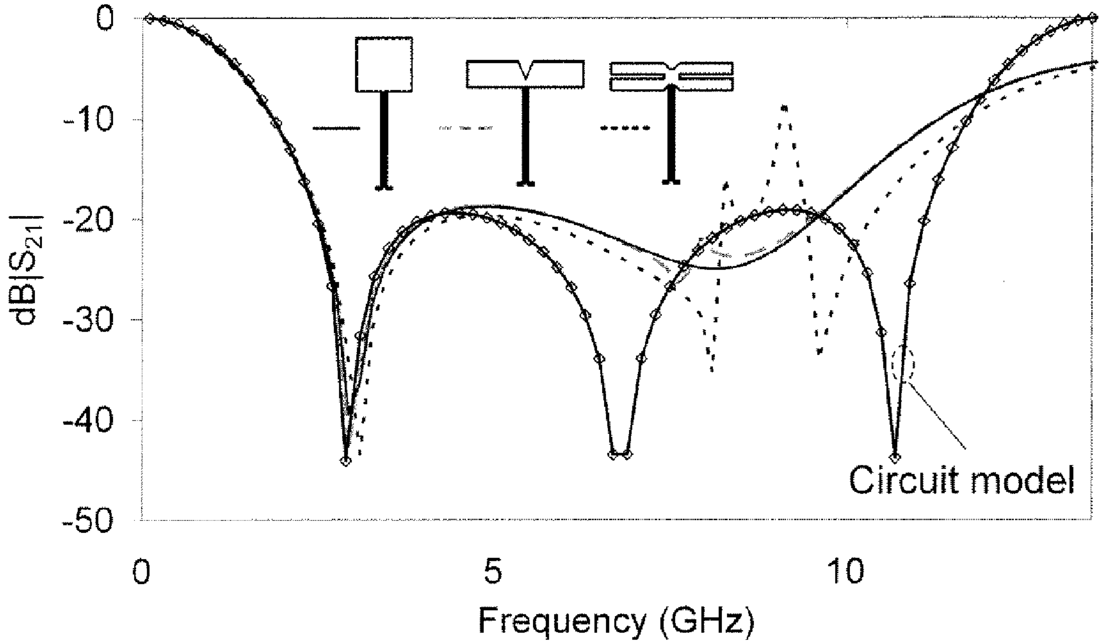
FIG. 6 is a graph depicting the frequency responses of three (3) unit elements of a microwave blocking filter, according to an example embodiment.

The pass-band for the microwave blocking filter is defined by $f_1$ of the unit element. The filter size may be reduced significantly by designing the filter at $f_0$ that is much greater than $f_1$. Referring to Equation (1), adjusting $Z_1$ to a minimal value would reduce filter size. However, this requires a wide transmission line in the $Z_1$ section (as shown in FIG. 2), which increases the filter's equivalent shunt capacitance. To reduce this capacitance without affecting the filter pass-band response, the low impedance open-ended portion (i.e. $Z_1$ section) may be split into two and four parts. Each section has an impedance of 2$Z_1$, and 4Z1, as shown in FIGS. 3 and 4, respectively. The physical length of $Z_1$ is shorter than that of $Z_c$ to compensate for the parasitic capacitance due to $Z_1/Z_c$ step discontinuity. The pass-band frequency responses illustrated in FIG. 6 agree well with the ideal response from the theoretical model. However, there is deviation from the ideal response above $f_1$. This is due to the relatively strong parasitic from step discontinuity between $Z_1$ and $Z_c$ that causes mismatch in odd-mode and even-mode propagation constants. In addition, the filter unit with $Z_1$ split into four sections (see FIG. 4) generates spurious responses. This is due to unequal effective electrical length among the four split sections.

Figure 7:
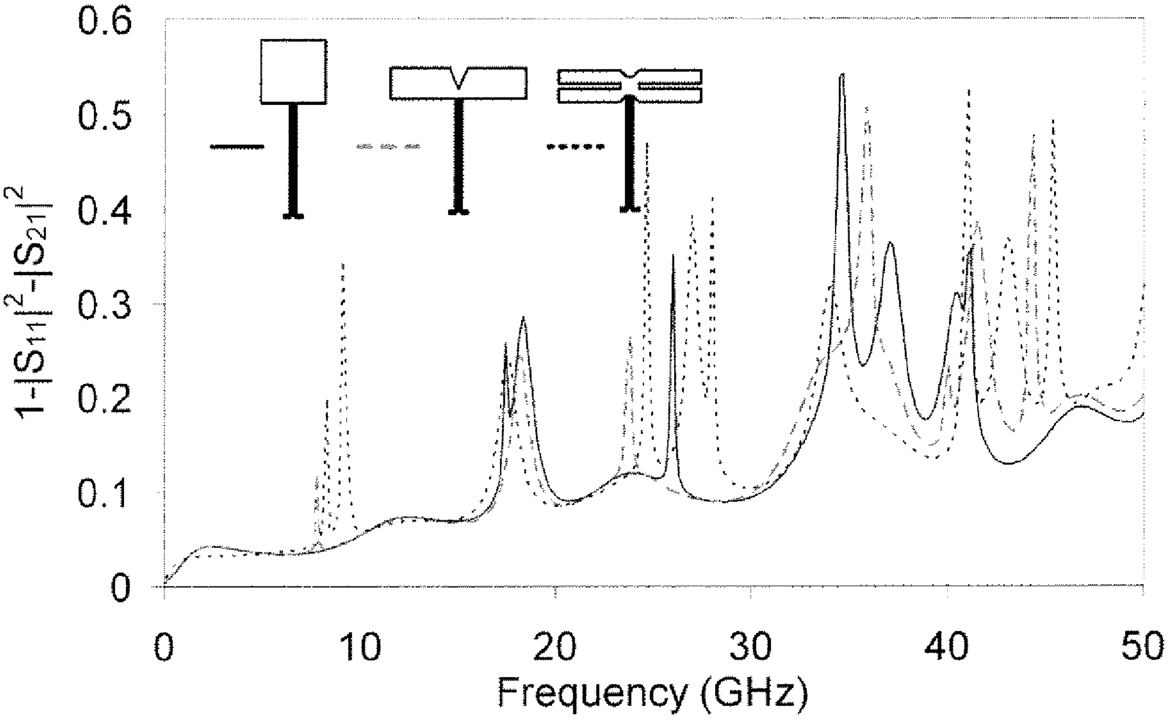
FIG. 7 is a graph depicting the total loss of three (3) unit elements of a microwave blocking filter, according to an example embodiment.

Despite its strong out-of-band spurious responses, the shunt capacitance in the $Z_1$ section is reduced about 2-11% in FIG. 3 and FIG. 4 compared to FIG. 2. The structure in FIG. 4 also produces lower radiation loss at low frequency (e.g., below 6 GHz as shown in FIG. 7, but it produces higher radiation loss out of band). This loss may be further suppressed and controlled by enclosing the filter in an appropriate cavity (e.g., conductive cavity).

Figure 8:
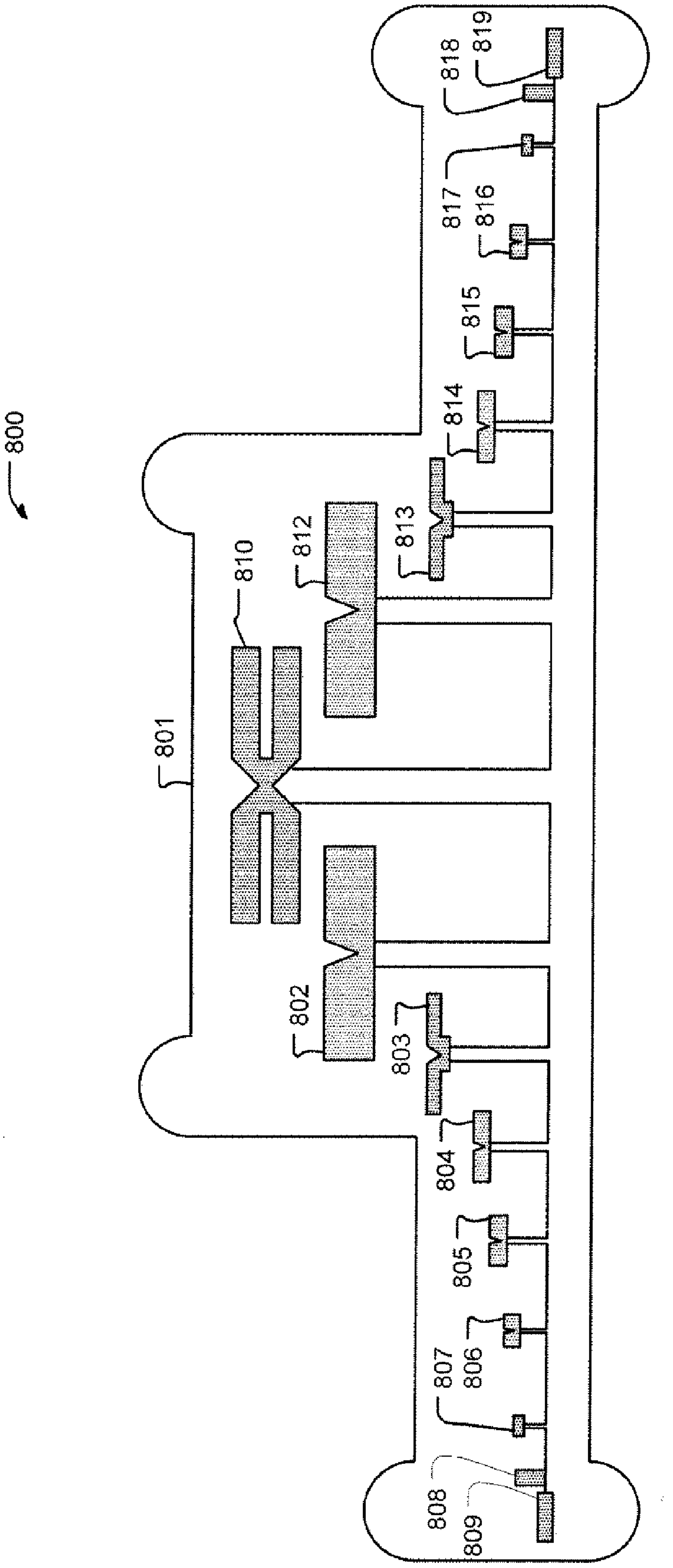
FIG. 8 is an example microwave blocking filter layout, according to an example embodiment.
Figure 9:
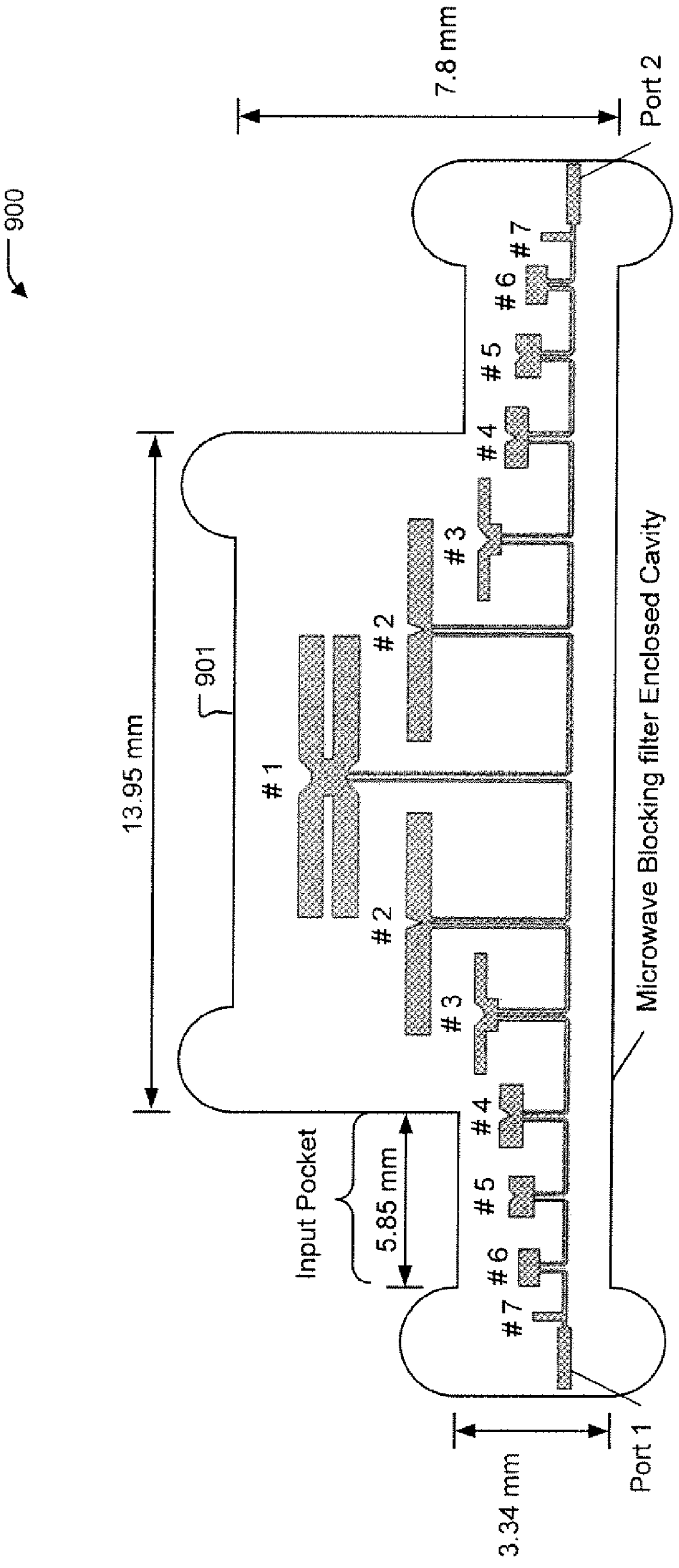
FIG. 9 is an example microwave blocking filter layout, according to an example embodiment.

Turning to FIGS. 8 and 9, example implementations of microwave blocking filters are discussed in detail. According to FIG. 8, microwave blocking filter 800 includes a substrate 801 and a plurality of filter unit elements disposed thereon. The first filter unit element, 810, is substantially similar to the unit element 400 discussed above. The first filter unit 810 includes a low impedance open-ended line divided into four (4) sections as described above, to limit or reduce shunt capacitance. Filter units 801, 812, 804, 814, 805, 815, and 806, 816 are substantially similar to unit element 300 discussed above. The filter units include a low impedance open-ended line divided into two (2) sections as described above, to limit or reduce shunt capacitance. Filter units 807 and 817 are substantially similar to unit element 200 discussed above.

The filter 800 further includes two ports 809 and 819, configured to interface with a communications line. Once connected the filter 800 blocks microwaves within the stop-band of the filter 800's design. For example, the filter 800 may be scaled to block any number of frequencies as discussed above, and different manufacturing materials and methods may yield different material properties, thereby affecting the stop-band of the filter 800.

Hereinafter a more detailed explanation of an actual example microwave blocking filter is described with reference to FIG. 9. Additionally, experimental results are provided along with materials used in design and manufacturing of the example microwave blocking filter and are discussed with reference to FIG. 10-12.

It is noted that although FIG. 9 includes particular dimensions, measurements, and other implementation specific details, example embodiments should not be limited to these details. FIG. 9 represents one example implementation at a particular scale only, and example embodiments may be scaled using the detail and equations set forth above to achieve different frequency responses. The microwave blocking filter 900 includes a plurality of filter units, for example, which may be similar to those illustrated in FIGS. 1-4 and 8. The actual size of each of the filter units (#1-#7) determines the upper frequency limits at which the filter 900 is operational. The limits are maximum stop-band attenuation and operating frequency, which are dependent upon the actual implementation (i.e., size and type of dielectric, enclosed area, and transmission line fabrication resolution).

Microstrip transmission is used for the filter unit elements #1-#7. An electrically thin dielectric substrate is used in the design to avoid surface wave propagation at the highest frequencies of interest. Metal walls are used to enclose the structure to prevent unimpeded radiation propagation through the filter housing. The physical limits due to these factors are computed in terms of maximum operating frequency and summarized in Table 1 given below:

TABLE 1

| Propagation Medium | Minimum Design Feature Size | Major Frequency Limitations | Maximum Filter Design Frequency |
|---|---|---|---|
| Micro strip line on 0.13 mm thick substrate | 0.18 mm × 0.63 mm | line width/line ration | 45.5 GHz |
| Substrate with $\epsilon = 10.2$ | 0.127 mm thick | Surface wave TM0 cut-off frequency | 193 GHz |
| Metal Enclosure | 3.34 mm × 2.54 mm cross-sectional area | Waveguide Cavity Resonances TE100 cut off frequency | 45.2 GHz |

From Table 1, the maximum frequency at which the filter may operate is limited by the microstrip physical dimensions. Therefore, the small metal enclosure is designed to suppress waveguide propagation mode above 45 GHz and filter is constructed using seven different element sizes connected in series as shown in FIG. 9. The elements described previously are reused with the electrical length scaled to operate at various frequency bands. Each of which is designed such that its stop-band frequencies overlapped with the adjacent one. The minimum feature used in this design is a quarter-wavelength stub in section #7 and it is limited to fabrication resolution. It is used to suppress the spurious responses at 45.5 GHz. The $Z_1$ of section #1 is split into 4 sections while $Z_1$ in sections #2-#5 are split into two sections to minimize parasitic shunt capacitance. Section #6 represents the smallest realizable band-stop filter implemented in this design. For design simplicity, all sections have the same $Z_c$ and c value of 61 Ohm and 0.26, respectively. Their circuit parameters and frequency characteristics are summarized in the Table 2.

TABLE 2

| # | f_0 (GHz) | Z1 (Ω) | DC Capacitance (pF) | Frequency Coverage (GHz) | Minimum Stop-band Attenuation (dB) |
|---|---|---|---|---|---|
| 1 | 4.88 | 7 | 4.9 | 2.5-8 | 19 |
| 2 | 10.6 | 10 | 2.03 | 4.5-15 | 19 |
| 3 | 17.2 | 17.2 | 0.71 | 11-20 | 20 |
| 4 | 28 | 11 | 0.53 | 16-34 | 25 |
| 5 | 35 | 10.2 | 0.39 | 23-47 | 23 |
| 6 | 40 | 23 | 0.3 | 28-57 | 20 |
| 7 | 45.5 | 40 | 0.11 | 44-47 | 20 |

Each element is placed in series increasing in size towards the center of the structure. This gradual increase in size allows high frequency signals to be blocked by smaller elements with low radiation loss before a signal reaches section #1 and #2 which have high radiation around the center of the filter. Short transmission line length with $Z_0$=53 Ohm is used to connect between elements to minimize the total filter length. In addition, a small input pocket is implemented around the filter terminal as shown in FIG. 9 to block low frequency radiation produced from the center of the structure.

Figure 10:
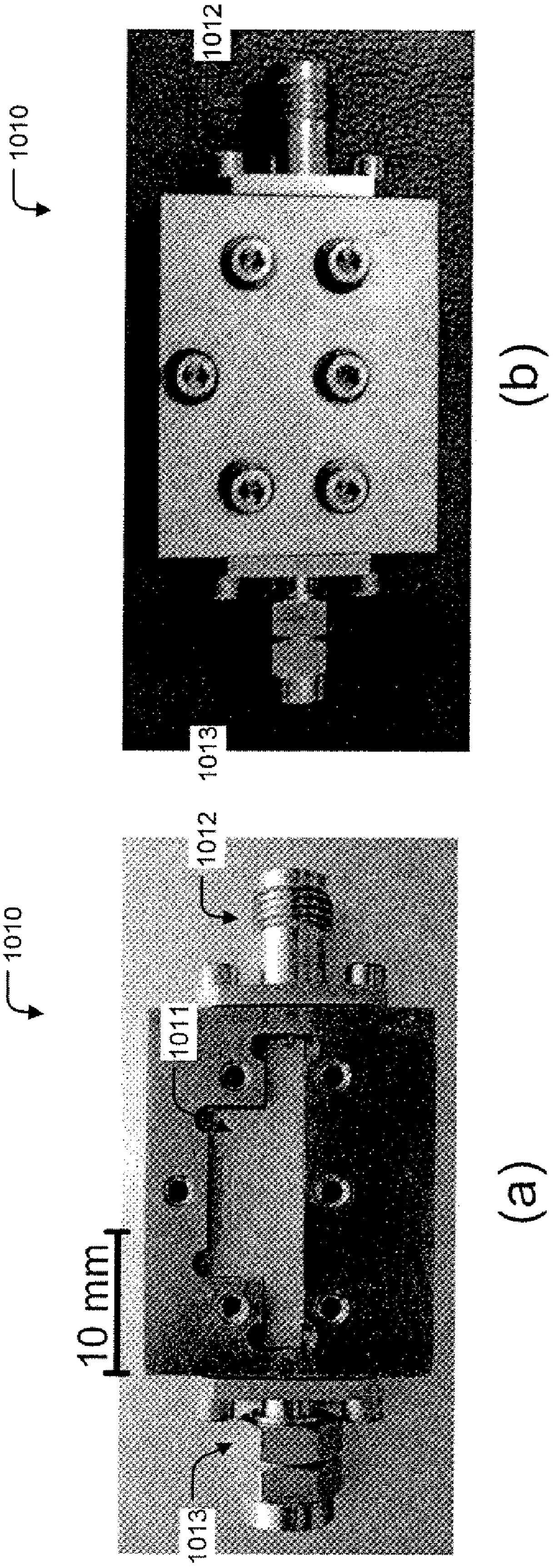
FIG. 10 is a photograph of a packaged microwave blocking filter including two (2) views, according to an example embodiment.

FIG. 10 is a photograph of the packaged microwave blocking filter including two (2) views, according to an example embodiment. The microwave blocking filter 1011 is housed within the pictured structure 1010. View (a) depicts each individual filter unit element disposed on the dielectric substrate. The microstrip filter is fabricated on 0.127 mm-thick ceramic polytetrafluoroethylene (PTFE) composite dielectric substrate. The filter is attached to a copper enclosure using conductive silver epoxy, the microstrip enclosure wall height is 2.54 mm. The filter is connected to 2.4 mm connectors (1012, 1013) as shown in FIG. 10. The connectors center coaxial pins are soldered to the wide microstrip pads at both ends of the filter (e.g., ports 1 and 2 of FIG. 9).

Figure 11:
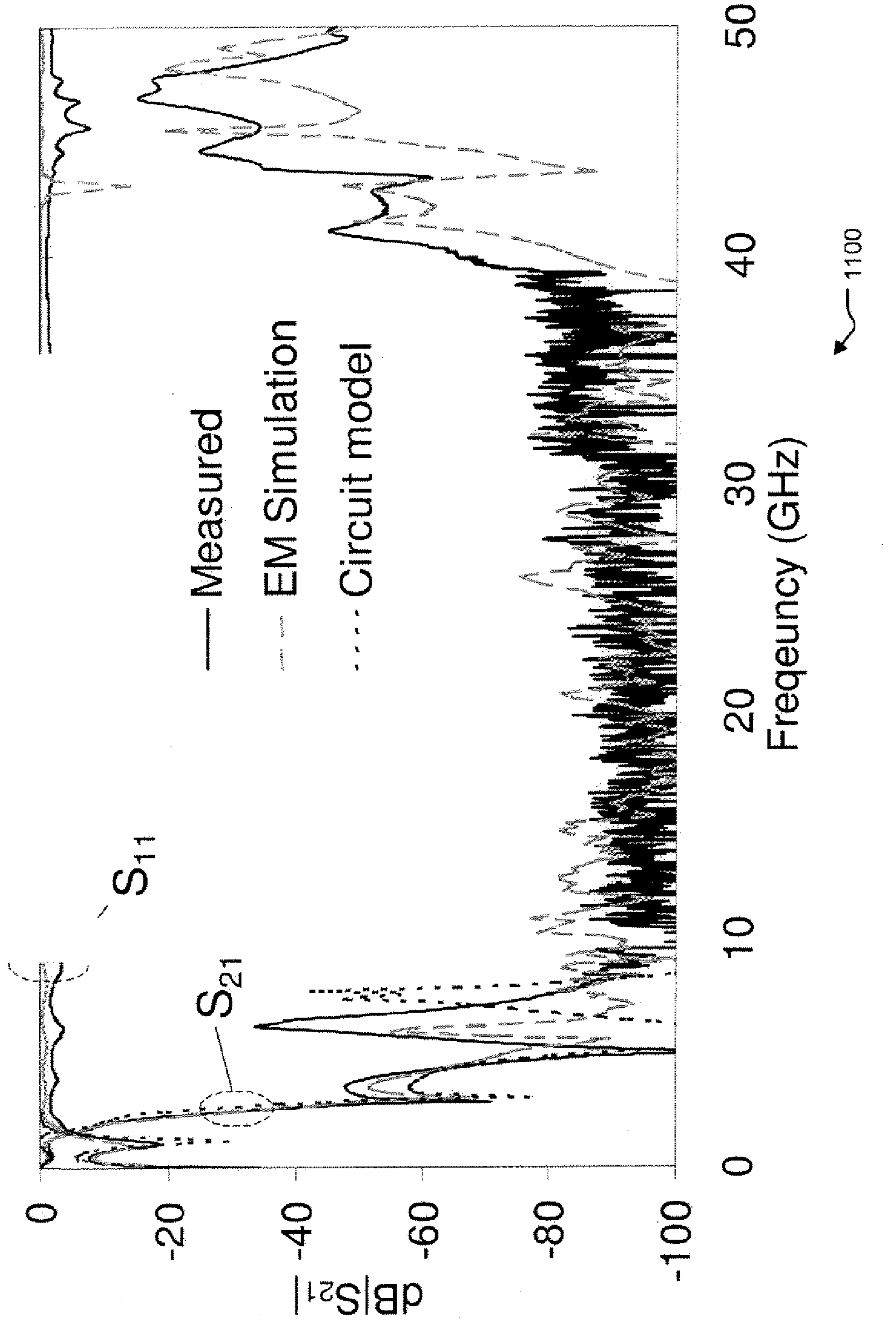
FIG. 11 is a graph depicting the measured and simulated frequency responses of a microwave blocking filter according to an example embodiment.

FIG. 11 is a graph depicting the measured and simulated frequency responses of the microwave blocking filter 1010. The electro-magnetic (EM) simulation results are compared with measurement results in FIG. 11 and good agreement is realized. The transmission line circuit model predicts the response well below 10 GHz but cannot predict the stop-band attenuation level at high frequency due to complex interaction among elements.

Figure 12:
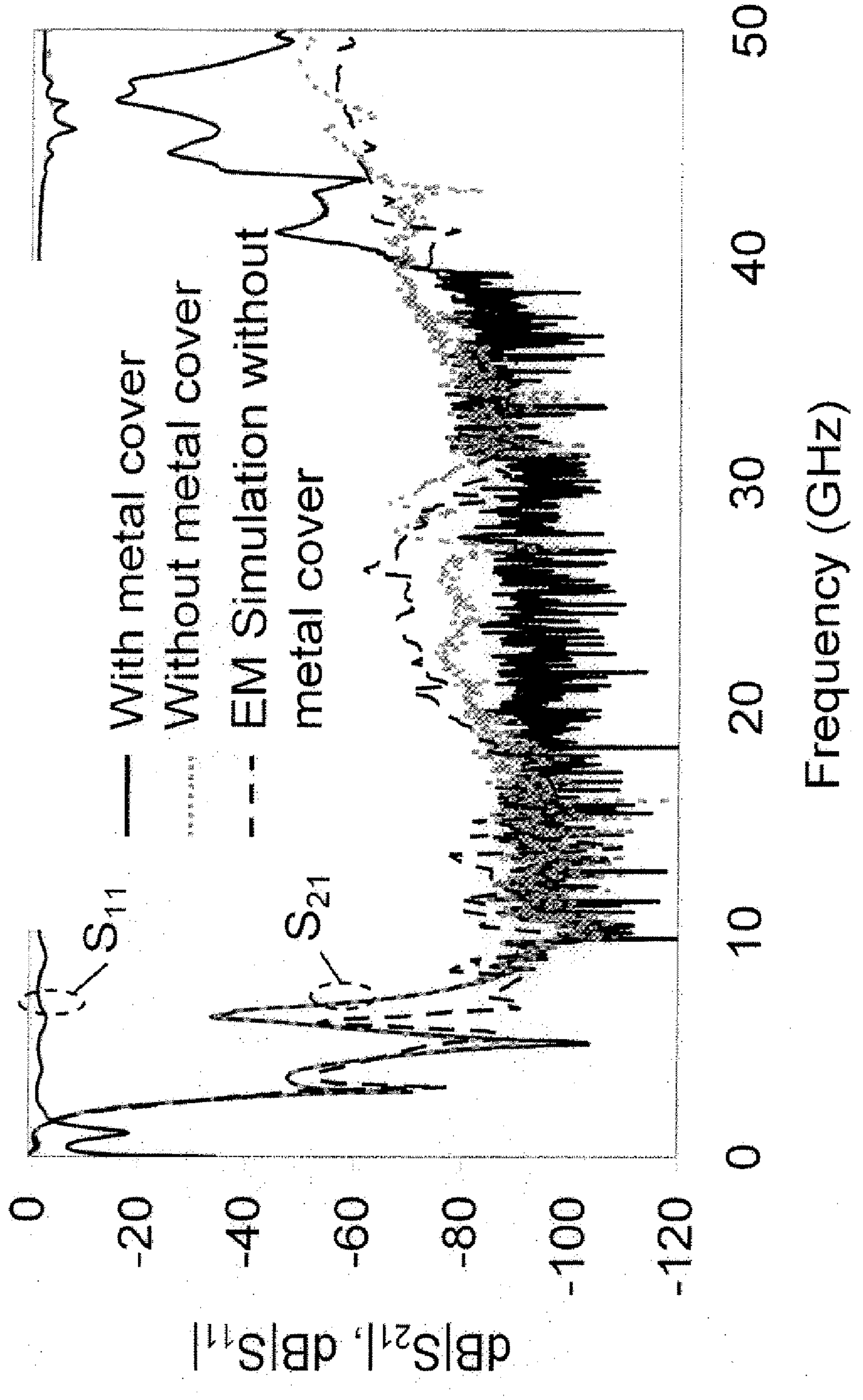
FIG. 12 is a graph depicting the measured and simulated frequency responses of a packaged microwave blocking filter, according to an example embodiment.

FIG. 12 is a graph depicting the measured and simulated frequency responses of a packaged microwave blocking filter, according to an example embodiment. From this result, one of the spurious responses at 6.3 GHz is higher than that simulated. This is due to tolerance error in the coupled line spacing that changes transmission zero frequency locations in section #2. Without the top metal cover that encloses the filter, the filter offers extended rejection bandwidth to more than 50 GHz as shown in FIG. 12. The effect of radiation can be observed above 40 GHz when the filer is enclosed in a cavity. This is a result from the input pocket's length to attenuation the signal close to its TEI00 cut-off frequency. The measured capacitance and inductance excluding connectors is 22.5 pF and 45 nH at 10 kHz, respectively. The filter DC resistance is measured to be 0.925 Ohm at room temperature.

It is noted again that although particular measurements, dimensions and other implementation specific details have been discussed above with reference to FIGS. 9-12, example embodiments should not be so limited.

As discussed above, example embodiments of the present invention are directed to microwave blocking filters. The filters may provide isolation between the cooled elements of low-noise sensors and room temperature readout and bias electronics in cryogenics electronics systems without the drawbacks of the conventional art. Further, given the high blocking capabilities of the filters described, example embodiments also provide low-pass filters for microwave communication systems (e.g., to suppress out-of-band interferences).

Example embodiments include transmission line elements that produce band-stop frequency responses. The filters disclosed use signal reflection, due to transmission line impedance contrast and transmission zeros generated by coupled lines, to block microwave transmission. The level of reflection is dependent on the number of filter unit elements combined in series and the proper enclosure size to cover these filter unit elements. In addition, the enclosed package may prevent additional filter radiation from reaching the input/output terminals. This results in an ultra-high microwave signal blocking capability.

Example embodiments include filters consisting of two sections. The first section is a metal/conductive pattern (e.g., metal, copper, aluminum, niobium, superconductive material, etc) printed on a substrate (e.g., dielectric, semiconductor, degeneratively-doped semiconductor, etc). The second section is an enclosure/housing of conductive material (e.g., metal, metalized polymer, conductive layer, etc). The enclosure is configured to be attached to/cover the first section. Finally, the input/output ports of the filter may be configured according to various different types of external interface.

Example blocking filters include unit elements combined in series. Each unit element has three transmission zero frequencies that provide limited suppression bandwidth. By combining many unit elements of various sizes in series, many transmission zero frequencies are generated that are spread across a wide frequency band and provide significant signal blocking capability. High impedance contrast is used to ensure a compact filter design. In addition, the overall equivalent shunt capacitance may be reduced/minimized using split-end transmission line elements. The reflection capability is enhanced by using electrical wall around the filter. The wall may inhibit low frequency signal from radiation and this frequency is set by the dimension of the enclosure walls.

The filters disclosed may be scaled to different sizes to reflect microwave signals at various frequency bands. For example, according to at least one example embodiment, a microwave blocking filter produces a band-stop/frequency response in the THz range.

While the invention is described with reference to an exemplary embodiment, it will be understood by those skilled in the art that various changes may be made and equivalence may be substituted for elements thereof without departing from the scope of the invention. In addition, many modifications may be made to the teachings of the invention to adapt to a particular situation without departing from the scope thereof. Therefore, it is intended that the invention not be limited the embodiments disclosed for carrying out this invention, but that the invention includes all embodiments falling with the scope of the appended claims. Moreover, the use of the terms first, second, etc. does not denote any order of importance, but rather the terms first, second, etc. are used to distinguish one element from another.

What is claimed is:

1. A compact planar microwave blocking filter with a predetermined shunt capacitance, comprising:

a plurality of a set of filter unit elements disposed on a substrate, the substrate being one of a degeneratively doped semiconductor substrate, and a dielectric substrate, the plurality of said set of filter unit elements being interconnected in a symmetrical series cascade with filter unit elements being organized in the series based on physical size; wherein, a first filter unit subset element of the plurality of said set of filter unit elements includes a low impedance open-ended line configured to reduce the shunt capacitance of the filter; the plurality of said set of filter unit elements further including:

a quarter-wavelength stub for suppressing spurious responses at approximately 45.5 GHz, with multiple sections of said first filter subset element combined in series, said first filter unit subset element split into multiple sections with equivalent minimized parasitic shunt capacitance; each first filter subset element including split-end transmission unit elements to provide limited suppression bandwidth.

2. The filter of claim 1, further comprising a conductive housing configured to alter the frequency response of the filter.

3. The filter of claim 2, wherein the housing is comprised of a metal.

4. The filter of claim 1, wherein the symmetrical series cascade of the plurality of filter unit elements is configured to reduce radiation loss of the filter.

5. The filter of claim 1, wherein each of the plurality of filter unit elements is configured to provide overlapping stop-bands between the filter unit elements.

6. The filter of claim 1, wherein each filter unit element of the plurality of filter unit elements includes a low impedance open-ended line.

7. The filter of claim 6, wherein each filter unit element of the plurality of filter unit elements includes a coupled line portion in communication with the open-ended line.

8. The filter of claim 7, wherein the plurality of filter unit elements are interconnected through respective coupled line portions.

9. The filter of claim 1, wherein the low impedance open-ended line of the first filter unit element is divided into four sections of roughly equal area.

10. The filter of claim 1, wherein the low impedance open-ended line of the first filter unit element is the largest low impedance open-ended line of the plurality of filter unit elements.

11. The filter of claim 10, wherein the first filter unit element is disposed in the center of the symmetrical series cascade.

12. The filter of claim 1, wherein a second filter unit element of the plurality of filter unit elements includes a low impedance open-ended line divided into two sections of roughly equal area and configured to reduce the shunt capacitance of the filter.

13. The filter of claim 1, further comprising a metal housing disposed on the substrate and covering completely the symmetrical series cascade of filter unit elements, the metal housing including two ports on opposite ends of the housing, the two ports being in communication with two smallest filter unit elements of the filter.

14. The filter of claim 1, wherein the plurality of said set of filter unit elements are comprised of a superconducting material.

* * * * *